United States Patent
Jeppe et al.

(10) Patent No.: US 12,047,171 B2
(45) Date of Patent: Jul. 23, 2024

(54) SELECTION OF PIVOT POSITIONS FOR LINEAR NETWORK CODES

(71) Applicant: Steinwurf ApS, Aalborg (DK)

(72) Inventors: Pihl Jeppe, Aalborg (DK); Morten V. Pedersen, Aalborg (DK)

(73) Assignee: Steinwurf ApS, Aalborg (DK)

( * ) Notice: Subject to any disclaimer, the term of this patent is extended or adjusted under 35 U.S.C. 154(b) by 0 days.

(21) Appl. No.: 18/245,234

(22) PCT Filed: Jul. 5, 2021

(86) PCT No.: PCT/EP2021/068552
§ 371 (c)(1),
(2) Date: Mar. 14, 2023

(87) PCT Pub. No.: WO2022/058063
PCT Pub. Date: Mar. 24, 2022

(65) Prior Publication Data
US 2023/0361914 A1    Nov. 9, 2023

(30) Foreign Application Priority Data
Sep. 18, 2020   (EP) .................................. 201968542

(51) Int. Cl.
*H04L 1/00* (2006.01)
(52) U.S. Cl.
CPC .......... *H04L 1/0076* (2013.01); *H04L 1/0057* (2013.01)
(58) Field of Classification Search
CPC .. H04L 1/0076; H04L 1/0057; H03M 13/373; H03M 13/13
See application file for complete search history.

(56) References Cited

U.S. PATENT DOCUMENTS 8,130,776 B1 * 3/2012 Sundararajan .......... H04L 47/27
370/463
9,209,943 B1 * 12/2015 Firoiu ................... H04L 1/1607
(Continued)

OTHER PUBLICATIONS

Y. Li, W.-Y. Chan and S. D. Blostein, "On Design and Efficient Decoding of Sparse Random Linear Network Codes," in IEEE Access, vol. 5, pp. 17031-17044, 2017.*
(Continued)

*Primary Examiner* — Steve N Nguyen
(74) *Attorney, Agent, or Firm* — DALY, CROWLEY, MOFFORD & DURKEE, LLP

(57) ABSTRACT

A method for encoding data comprises choosing a sequence of pivot candidate positions for a sequence of g encoding vectors to encode a block of g data symbols in a round of coded packets by: providing a set of g pivot candidate positions; choosing a pivot candidate position for the sequence from the set of pivot candidate positions; removing the chosen pivot candidate position from the set of pivot candidate positions; and repeating until the set of pivot candidate positions is empty and the sequence of chosen pivot candidate positions for the round is non-linear. A set of encoding vectors is generated based on the chosen sequence of pivot candidate positions, each encoding vector comprising zero valued coefficients for positions within the encoding vector before the pivot candidate position for the encoding vector and a non-zero valued coefficient for at least the pivot candidate position.

11 Claims, 11 Drawing Sheets

(56) References Cited

U.S. PATENT DOCUMENTS

| | | | |
|---|---|---|---|
| 11,452,003 B1* | 9/2022 | Yin | H04L 49/552 |
| 2010/0046371 A1* | 2/2010 | Sundararajan | H04L 1/1635 |
| | | | 370/235 |
| 2011/0142141 A1* | 6/2011 | Huang | H04L 47/10 |
| | | | 375/242 |
| 2013/0058276 A1* | 3/2013 | Somasundaram | H04L 1/0076 |
| | | | 370/328 |
| 2017/0118674 A1* | 4/2017 | Narasimha | H04W 72/04 |
| 2018/0373673 A1* | 12/2018 | Jiang | G06F 17/16 |
| 2021/0357476 A1* | 11/2021 | Lee | G06N 3/04 |

OTHER PUBLICATIONS

International Search Report and Written Opinion dated Sep. 16, 2021 for International Application No. PCT/EP2021/068552; 16 pages.

Janus Heide et al., "Perpetual Codes for Network Coding"; XP055774458, Sep. 15, 2015; 13 pages.

Janus Heide et al., "A Perpetual Code for Network Coding"; 2014 IEEE 79$^{th}$ Vehicular Technology Conference (VTC—Spring 2014), Seoul, Korea, May 18-21, 2014. XP055774450, May 1, 2014; 6 pages.

Qureshi Jalaluddin et al., "Erasure Coding for Ultra-Low Power Wireless Networks"; IEEE Transactions on Green Communications and Networking, IEEE vol. 3, No. 4, XP011757587, Dec. 1, 2019; 10 pages.

Janus Heide et al., "On Code Parameters and Coding Vector Representation for Practical RLNC"; 2011 IEEE International Conference on Communications, Kyoto, Japan, Jun. 5-9, 2011. XP031908765, Jun. 5, 2011; 5 pages.

* cited by examiner

Output:
Round 0: [3, 7, 4, 9, 8, 6, 2, 5, 0, 1]
Round 1: [4, 8, 5, 0, 9, 7, 3, 6, 1, 2]
Round 2: [5, 9, 6, 1, 0, 8, 4, 7, 2, 3]
Round 3: [6, 0, 7, 2, 1, 9, 5, 8, 3, 4]
Round 4: [7, 1, 8, 3, 2, 0, 6, 9, 4, 5]

Figure 11

SELECTION OF PIVOT POSITIONS FOR LINEAR NETWORK CODES

CROSS REFERENCE TO RELATED APPLICATIONS

This application is a National Stage Entry of International Application No. PCT/EP2021/068552, which was filed on Jul. 5, 2021, which claims the benefit of European Application No. 20196854.2, which was filed on Sep. 18, 2020. The entire contents of these applications are incorporated herein by reference.

FIELD

The present invention relates to a method for encoding data.

BACKGROUND

An Erasure Correcting Code (ECC) is a useful tool when building efficient and scalable over-the-air communication systems. The basic principle is to (1) at an encoder produce a stream of coded packets from a block of source data, and (2) at a decoder collect the coded packets in order to reconstruct the original block of source data.

FIG. 1 shows the basic architecture of an ECC based system. A common scenario is to have a single encoder 10 transmit coded packets to a single decoder 20. However, in many practical applications (e.g. multicasting) a single encoder 10 may also transmit simultaneously to many decoders 20-1, 20-2 . . . 20-$m$ either via the same or different communication channels (wired, wireless, etc.) 30-1, 30-2, 30-$p$. Alternatively, several encoders 10-1, 10-2, 10-$n$ may also be used, so long as they operate over the same block of source data.

In practice, a file or stream may be split into multiple blocks. A block comprises g source symbols each of size m bytes, where g is called the block size and where the block contains g·m bytes. If multiple blocks are used, they may have different sizes. In addition, within a block unequally sized source symbols can also be used, in which case zero padding or similar techniques can be used during encoding and decoding.

A challenge in ECC based systems is when the block of source data grows large (e.g. 1000s of source symbols), as this results in a high computational complexity in the encoder and decoder.

This problem is often dealt with in one of two ways:
1. Split the block of source data into multiple smaller and more manageable blocks. This solution however often introduces inefficiencies into the system when many receivers are involved. Each receiver may be missing a different subset of the blocks and each transmission from the sender may therefore only benefit a subset of the receivers.
2. Use a single or large block but structure the encoding to lower the decoding complexity. One popular approach is to use a sparse code in which a single coded symbol is a linear combination of only a very limited set of source symbols—i.e. most of the encoding vector coefficients for any given coded packet will be zeros. g source symbols will be transmitted in g encoded packets in a round having the encoding vector varying for each coded packet of the round.

If using a well-designed sparse ECC, option (2) often provides the most efficient use of the communication channel. In addition, using a large block simplifies the overall system design.

Referring to FIG. 2, in order to perform the encoding of a block of data, the g source symbols comprising the block are typically arranged into a matrix $M=[m_0, m_1, \ldots, m_{g-1}]$, where each $m_i$ is a column vector.

To produce a given coded symbol x, M is multiplied with an encoding vector v containing g coding coefficients over some finite field GF. A practical interpretation is that each coded symbol is a mix of one or more source symbols and corresponding coding coefficients—with many of the coefficients being zero in a sparse scheme.

The process of producing the encoding vector is key to the performance of network coding. Some strategies include a systematic phase wherein all g source symbols are sent as is. Other strategies use deterministic methods based on feedback while other strategies produce random coding coefficients using probabilistic methods.

Each coded symbol and information representing the encoding vector used are included in a coded packet. Note, that in the coded packet, the encoding vector may be represented by the actual coding coefficients or any other representation which allows the decoder to reconstruct the encoding vector. A common implementation is to use a seed to a random number generator.

The purpose of the decoder is to undo the mixing of source symbols performed by the encoder in order to recover the g source symbols. In general, it holds that decoding can be completed after adding g linear independent coded packets to the decoder. We say that a coded packet is linear independent if and only if the encoding vector recovered from the coded packet is linearly independent with respect to any previously recovered encoding vectors for the specific block. If a coded packet is determined as linear dependent, it contributes no useful information to the decoding and may be discarded.

In practice decoding of a round of encoded packets is often performed by arranging the received encoding vectors as rows in a matrix X and the coded symbols as rows in a matrix G. Initially before receiving any coded packets both the matrix X and matrix G will contain only zeros. For each coded packet that arrives, the decoder performs Gauss-Jordan elimination on the incoming encoding vector and non-zero rows of X. All row operations performed on the encoding vector are also performed on the coded symbol with rows from the matrix G. If the incoming encoding vector is reduced to all zeros, the coded packet is linear dependent and will be discarded. Conversely if the encoding vector contains non-zero coefficients the coded packet is linear independent and the encoding vector and coded symbol can be inserted into X and G respectively.

When inserting an encoding vector and coded symbol at the decoder we say that the decoder has a pivot at j if it contains a linear independent non-zero row in the matrix X where the leftmost non-zero coefficient is at index j. Thus, a pivot is the leftmost non-zero coefficient of a linear independent coding vector. The number of pivots in the matrix X is called the rank of the decoder and decoding is complete once g pivots have been found.

A coded packet is directly insertable if no computations are needed to determine whether it is linear independent. This is the case if and only if the leftmost non-zero coefficient of the encoding vector represented in the coded packet does not have the same index of a pivot in the decoder. In the following we shall refer to the leftmost non-zero coefficient of the encoding vector represented in the coded packet prior to any computations as the pivot candidate, FIG. 3.

Directly insertable packets both decrease the coding overhead and minimize the amount of computational work that has to be done when decoding a symbol.

Today most sparse Random Linear Network Coding (RLNC) solutions generate the encoding vector according to some random distribution. This makes the coding overhead independent of the underlying communication channel, i.e., the solutions will perform the same over a channel with for example 0%, 10%, or 50% packet loss with or without bursts. An example of this process is explained in more detail in "Perpetual Codes for Network Coding", Janus Heide et al, 15 Sep. 2015 (https://arxiv.org/pdf/1509.04492.pdf). While this provides predictable computational complexity and coding overhead, it unfortunately also has a low ratio of directly inserted coded packets even when the packet loss is low.

Janus Heide et al, "On Code Parameters and Coding Vector Representation for Practical RLNC", Proc. 2011 IEEE International Conference on Communications, 5-9 Jun. 2011, Kyoto, Japan, pages 1-5, discusses drawbacks associated with RLNC including the complexity of the decoding and the overhead resulting from the encoding vector. Increasing the field size and generation size presents a fundamental trade-off between packet based throughput and operational overhead. On the one hand, decreasing the probability of transmitting redundant packets is beneficial for throughput and, consequently, reduces transmission energy. On the other hand, the decoding complexity and amount of header overhead increase with field size and generation length, leading to higher energy consumption.

Qureshi Jalaluddin et al, "Erasure Coding for Ultra-Low Power Wireless Networks", IEEE Transactions on Green Communications and Networking, IEEE, vol. 3, no. 4, 1 Dec. 2019, pages 866-875, discloses a sparse parallel concatenated coding (SPCC) scheme, in which sparsity and ratio of coded packets are optimized over GF(2) (i.e., Galois field of size two) and larger field size such as GF(32) for different values of k so that the total energy cost of the network is minimized.

In order for a decoder to determine whether a pivot candidate is directly insertable, it is sufficient to check if a pivot in the same position (i.e. a pivot having same index of a pivot candidate) for a round does not already exist. In the following we evaluate the fraction of pivot candidates that can be directly inserted using existing techniques.

As a baseline let us consider the case where the pivot candidate index (i.e. pivot candidate position within encoding vector) is produced at random uniformly from all available candidates at the encoder. This is the typical approach in most sparse ECC methods such as referred to above.

We first look at how many pivots we are missing at the decoder after receiving g coded packets.
1. The probability that pivot candidate is not selected is the probability that a different pivot candidate is selected: $1-(1/g)$.
2. The probability that a pivot candidate has not been selected after g tries is then $(1-(1/g))^g$.
3. The probability that a pivot candidate has been selected is then $1-(1-(1/g))^g$, which tends towards approximately 63% for as g increases.

This means that on average we will directly insert approximately 63% of the pivot candidates as pivots using the random uniform strategy.

Another way to improve the proportion of coded packets that can be directly inserted into the decoder is to use a systematic approach such as a linear sequence. In the linear sequence the encoder produces the pivot candidate index in order starting from 0, 1, 2 up to g−1 (and then the encoder restarts from 0 the index sequence production).

The g−1 indices produced are used to generate each encoding vector for a round. In each case, the encoding vector includes a non-zero coefficient from a finite field at the pivot candidate index position. Coefficients for index positions before the pivot candidate index position are zero; whereas coefficients for index positions after the pivot candidate position are determined according to the coding scheme, but in general these comprise a limited number of non-zero coefficients whose values and positions are known by the encoder and decoder—either implicitly or explicitly.

As an example, if g=10 the sequence of pivot candidate positions would look as shown in the rounds of FIG. 4.

If we consider the case where we have no losses, then only a single round of encoded packets would be needed for all receivers to be able to decode the data and each pivot candidate would be directly inserted and coding overhead would be zero. Also, for uniform random losses experienced from round to round, illustrated in FIG. 4, this approach works well and as the loss level increases, we approach the performance of the random uniform candidate production, described above.

To analyse the performance of the linear sequence approach, we look at how many pivots we are missing at the decoder after receiving g coded packets.
1. First we look at how many rounds we need to have g symbols received, i.e., how many times we will repeat the sequence. Given a packet loss p we need $1/(1-p)$ rounds.
2. The probability that a pivot candidate is received in one of the rounds is the probability that it was not lost in all rounds $1-p^{rounds}$.

Unfortunately, this does not work very well if packet loss is bursty or periodic. The fundamental problem is that since pivot candidate positions are selected in a linear fashion, we have a high probability of overlaps. If we have an overlap at index i then it is likely that i+1 will also overlap and so forth.

The model of FIG. 5 can be used to simulate bursty/periodic losses. The model has a good and bad state. In the good state burst length packets are received, followed by a random transition to either the good or bad state. In the bad state burst length packets are dropped followed by a random transition to either the good or bad state.

Referring to FIG. 6, it can be seen that the performance for using a linear sequence fluctuates widely, in particular when the losses are very bursty from round to round. In that case, we observe suboptimal worst-case behaviour and cases where a random uniform pivot candidate position selection strategy would perform better than the linear sequence strategy.

In summary, the two current strategies "Random Uniform Pivot Candidate Positions Selection" and "Linear Sequence Pivot Candidate Positions Selection" both feature significant drawbacks. When using a random uniform strategy, performance remains independent of the underlying channel (bursty, not bursty, amount of packet loss) however it consistently only allows direct insertion of approximately 63% of the symbols. The linear sequence strategy performs much better when packet loss is low and uniform. However, if losses are bursty, it exhibits fluctuating and poor worst case behaviour.

SUMMARY

According to the present invention there is provided a method for encoding data according to claim 1.

In a second aspect there is provided a computer program produced comprising computer readable code stored in a computer readable medium and including instructions which when executed in an encoder are configured to perform the steps of claim 1.

In a third aspect, there is provided an encoder configured to receive a block of data to be transmitted to one or more receivers and including a processor configured to perform the steps of claim 1.

Embodiments improve the performance of a sparse ECC by increasing the number of packets containing encoding vectors which are directly insertable in a decoding matrix within a decoder.

Embodiments decrease the coding overhead and minimize the amount of computational work that has to be done when decoding a coded symbol. This is especially useful for large block codes (i.e. codes are generated from a large block of symbols).

In some cases, the amount of directly inserted symbols is maximized when implementing network coding, for example when implementing Random Linear Network Coding (RLNC). The method presented is implemented at the encoder and assumes nothing about the communication channel and does not require feedback from the decoder to the encoder.

Embodiments ensure that pivot candidate positions selection at the encoder is randomized compared to any previous rounds.

BRIEF DESCRIPTION OF THE DRAWINGS

Embodiments of the invention will now be described, by way of example, with reference to the accompany drawings, in which:

FIG. 11 shows 5 rounds of pivot candidate positions selected according to one implementation of a first embodiment of the present invention.

DESCRIPTION OF THE EMBODIMENTS

In a first embodiment, in order to provide a stable and high fraction of directly insertable pivots at a decoder, there is provided a method in an encoder of selecting the positions of pivot candidates for the encoding vectors to be combined with a matrix of g data symbols in a round of coded packets. Once the encoding vectors have been determined and used to produce the round of coded symbols, coded packets including information representing the encoding vector and the coded symbols can be transmitted and decoded in a conventional, but more computationally efficient manner.

One implementation of the first embodiment comprises:
1. Given a block of source data containing g symbols.
2. In order to generate the pivot candidate positions 0 to g−1 for each encoding vector of a given round i:
   a. Without repetition for round i, pick at random a pivot candidate position from the set of pivot candidate positions 0 to g−1.
   b. Repeat from step 2a until all pivot candidate positions have been picked.
3. For each subsequent round repeat step 2.

As a consequence, each round will result in a "random sequence" permutation of the available pivot candidate positions. Each permutation may be provided using an unbiased random algorithm, however other random distributions are also possible.

Figure 1:
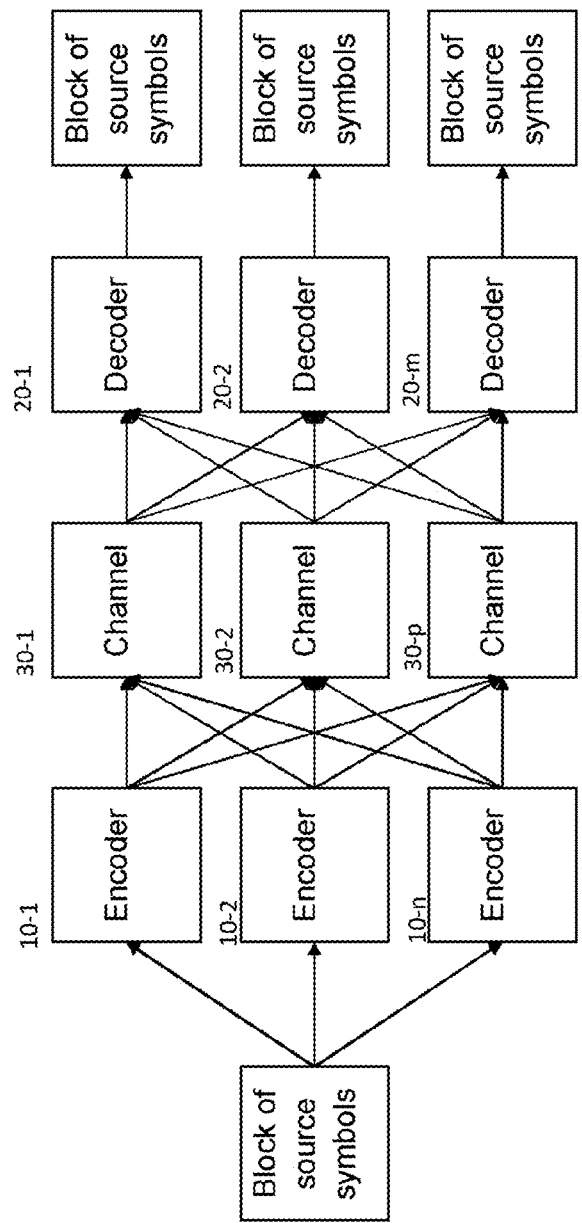
FIG. 1 shows a conventional encoder decoder structure.
Figure 2:
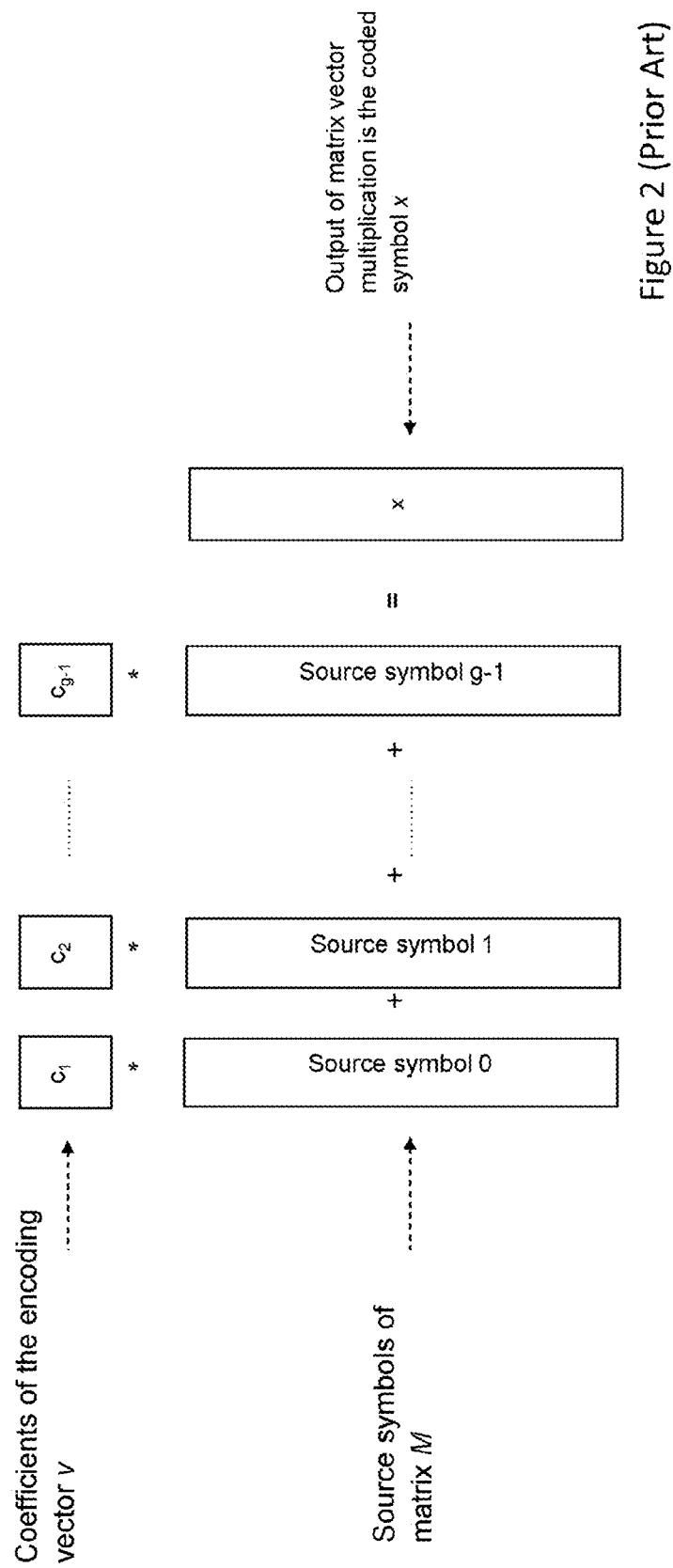
FIG. 2 illustrates a conventional encoding matrix.
Figure 3:
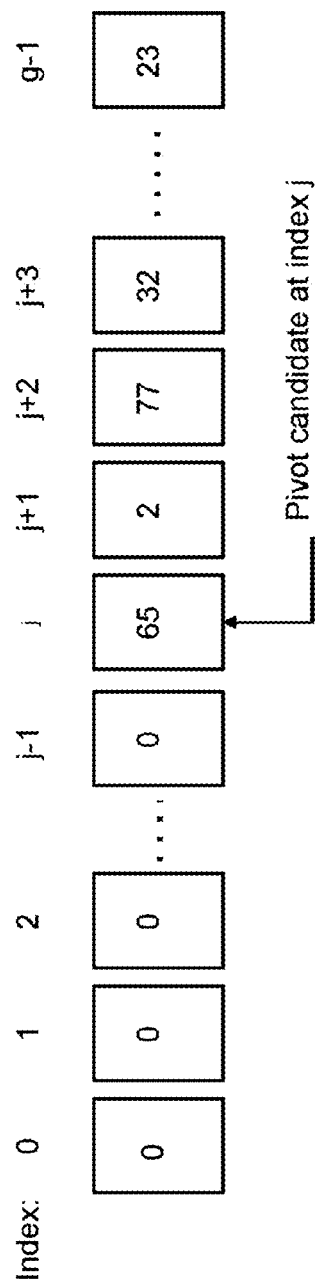
FIG. 3 illustrates a pivot candidate in an encoding vector.
Figure 4:
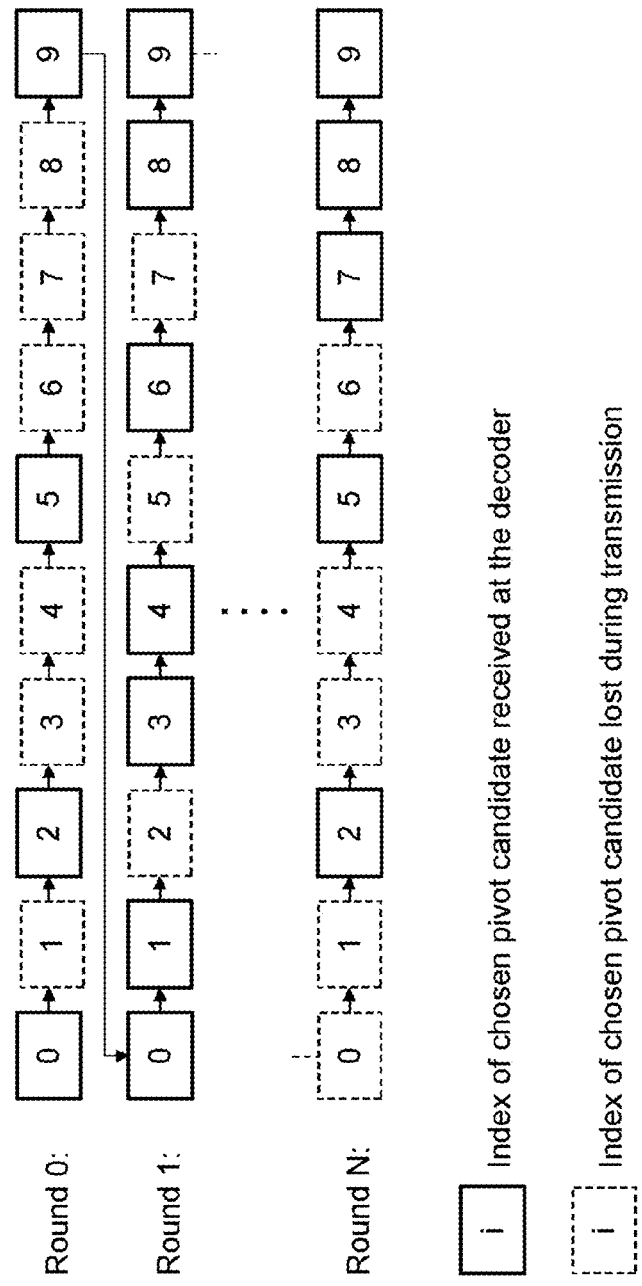
FIG. 4 illustrates exemplary pivot candidate positions production for a conventional linear sequence, where g=10 and packet loss is 50%.
Figure 5:
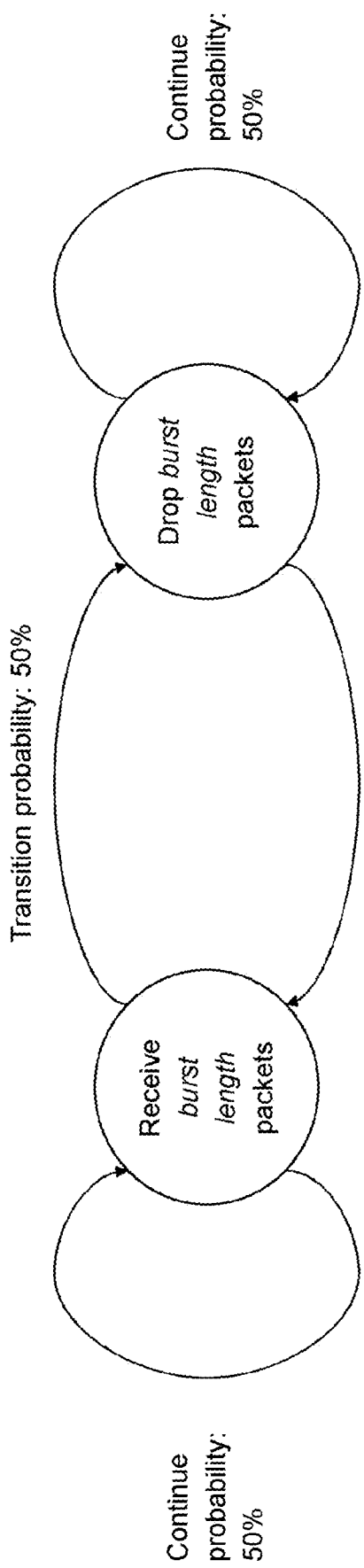
FIG. 5 illustrates an algorithm for simulating bursty losses used in assessing embodiments of the present invention.
Figure 6:
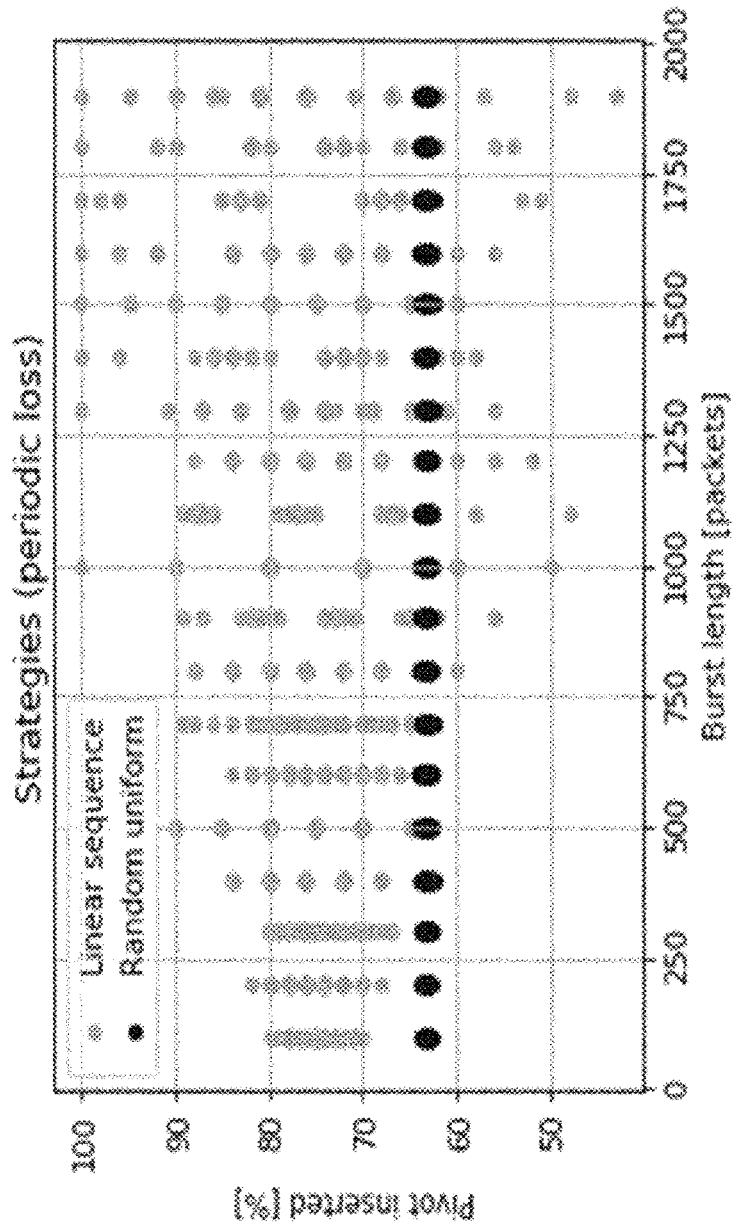
FIG. 6 compares results for conventional approaches to selecting pivot candidates for encoding vectors.
Figure 7:
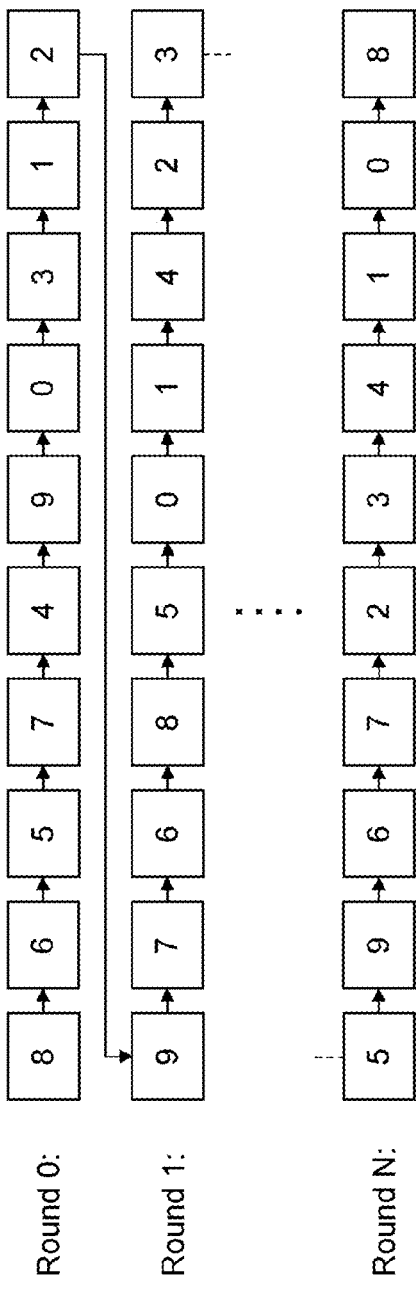
FIG. 7 illustrates the selection of pivot candidate positions for encoding vectors according to a first embodiment of the present invention where g=10.

As indicated, a pivot candidate position is selected at random, but without repetition, in each round, so for example, if g=10, the sequence of pivot candidate positions for a first Round 0 could look as shown in FIG. 7.

So assuming that coded packets are sent in order, in this case, the first packet will include a pivot candidate at index position 8. All coding coefficients before this position will be zero and the value of any coding coefficients after this position is determined by the coding scheme. The next packet will have a pivot candidate at index position 6, with all coding coefficients before this position being zero and the value of any coding coefficients after this position being determined by the coding scheme and so on for the rest of the round.

Figure 8:
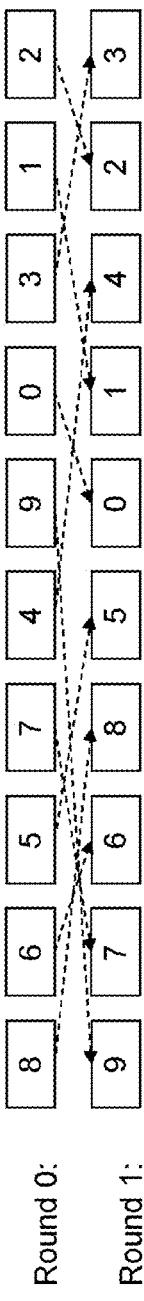
FIG. 8 illustrates round to round permutation of the pivot candidate positions of FIG. 7 in more detail.

In order to ensure the effects of bursty losses affecting multiple rounds of transmissions are minimized, in another implementation of the above described embodiment, rather than repeating step 2 for multiple rounds, the random sequence which is determined for a first round can be offset from subsequent round to subsequent round. FIG. 8 shows how the sequence for Round 0 can be permuted to produce the sequence for Round 1 by offsetting the sequence from round to round and similarly for successive rounds by one. Note that in variations of this implementation different offset values may be used.

The analysis of this approach is the same as for the linear sequence, since what dictates whether a pivot candidate can be directly inserted during a given round is whether a pivot in that position exists. We therefore get the same performance as for linear sequence in that if no packet loss occurs, we directly insert all pivot candidates and have zero overhead.

Figure 9:
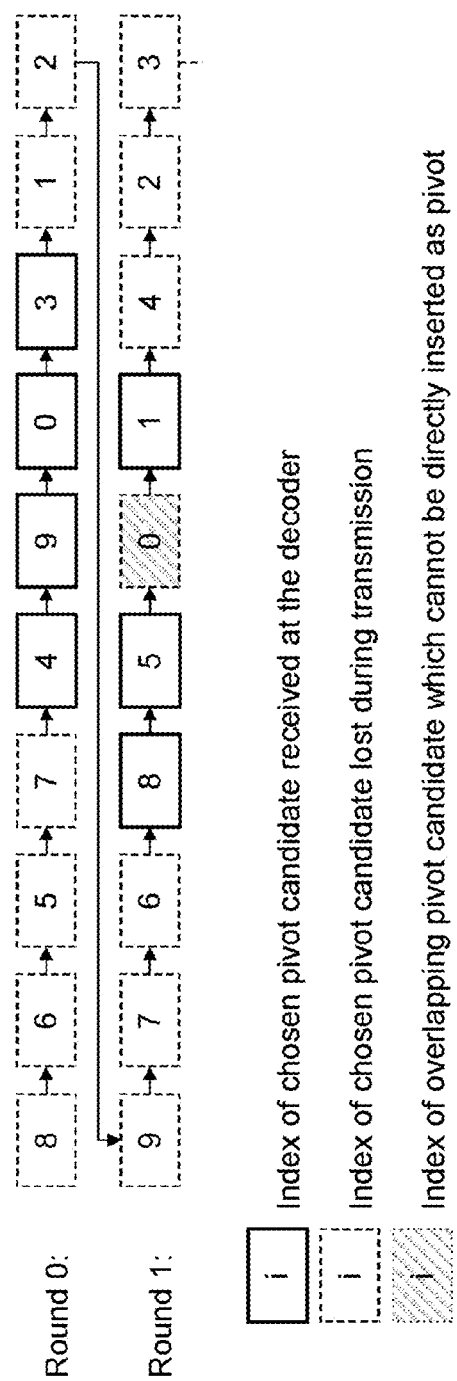
FIG. 9 illustrates the performance of a first embodiment of the present invention in spite of bursty losses.

However, if a channel experiences bursty or periodic packet loss across rounds, the "random sequence" approach of this embodiment decreases the probability of overlaps vis-à-vis repeating a linear sequence and thereby provides a more stable performance under those conditions. This is shown for the implementation of FIG. 9 where the permutation for one round is offset by one for each subsequent round, but this also applies if the permutation for each round is chosen as defined in step 2 above.

Figure 10:
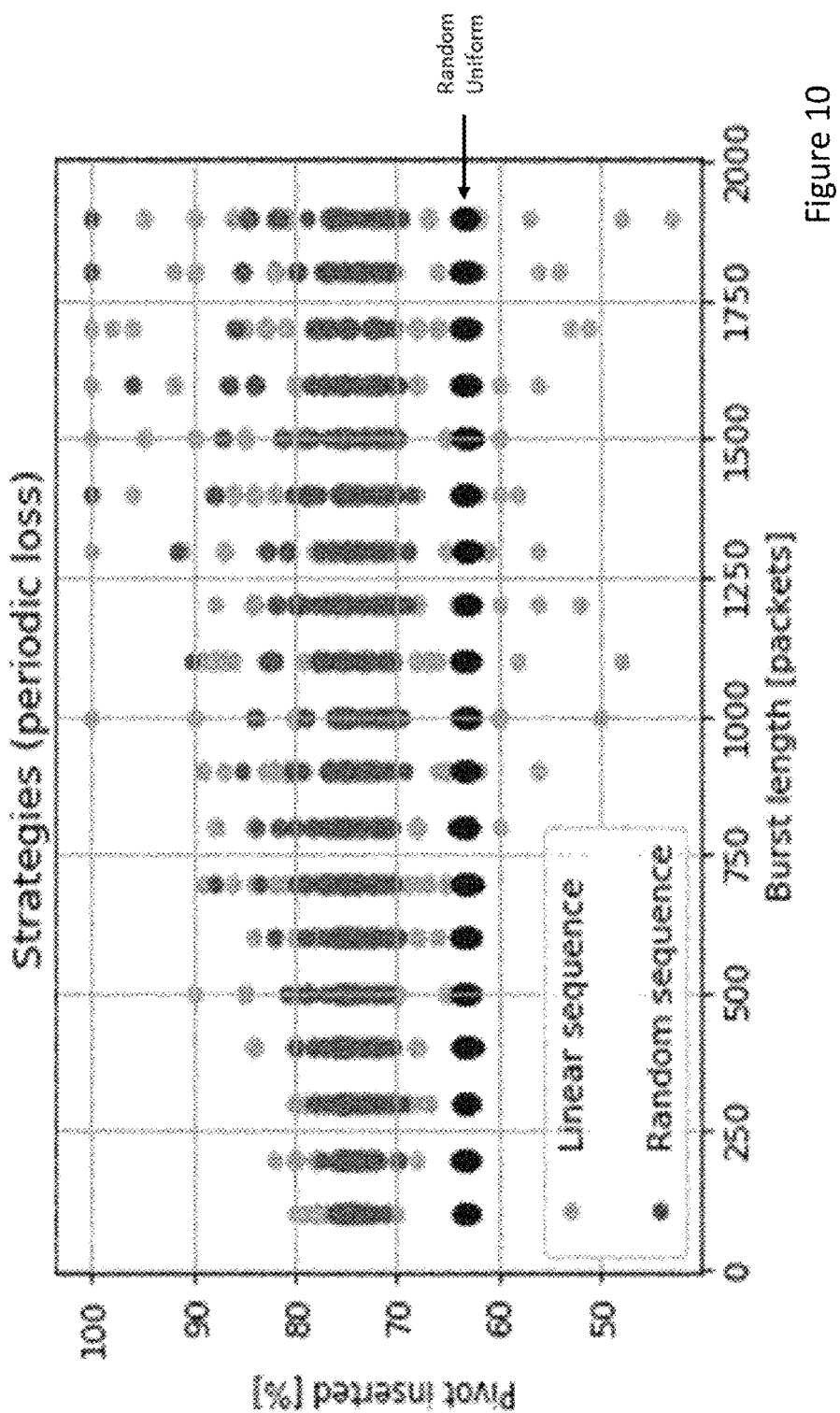
FIG. 10 shows results for a first embodiment of the present invention in comparison to conventional approaches to selecting pivot candidates for encoding vectors.

We can directly compare the fraction of directly insertable pivots between the prior linear sequence and random uniform sequence approaches and the "random sequence" approach of this embodiment as shown in FIG. 10.

As can be seen the "random sequence" strategy of the first embodiment improves the worst case behaviour of the "linear sequence" and performs consistently better than "random uniform" both under periodic loss and uniform loss models.

One implementation of the present random sequence approach is to generate a lookup table with a precomputed random permuted sequence of pivot candidate positions, e.g. using Fisher-Yates shuffle, and then upon each iteration randomly offset the sequence. Note, that in the implementations of the first embodiment, pivot candidates having same positions are not repeated within a single round to maintain the zero overhead property when we observe no losses.

In practice a look up table implementation works well for small block sizes. However, in cases where the block size grows large, it may not be practical. As an example, for a block size of 700 MB and a symbol size of 1400 bytes, a lookup table of 2 MB is needed. For some embedded devices, the amount of available memory is limited, and so an alternative and less memory consuming solution is desirable.

An alternative implementation with much lower memory consumption uses a property of finite fields, namely that a primitive element of a finite field GF(p) is a generator of the field. In other words, if a is a primitive element of some field GF(p) then any non-zero element of that field may be written as $a^i$ for some integer i. This means that if the number of elements in the field is p. We can generate all non-zero elements of the field by looping from i=0 to i=p−1.

Let us look at an example of GF(11). This is a finite field with 11 elements (10 non-zero elements) for which 2 is a primitive element.

The following Python program generates a pseudo random sequence:

```
# The chosen prime
prime = 11
# Since zero and the prime is not part of the generated
# sequence the number of pivot positions we can represent is
# number_pivot_positions
number_pivot_positions = prime - 1
# The primitive element for the chosen prime primitive_element = 2
# Our starting value
x = primitive_element
# The round offset added to scramble the sequence each round
round_offset = 0
def next_pivot_candidate_position(v):
    v = v * primitive_element
    v = v if v <= prime else v % prime
    return v
# Example 5 rounds
for _ in range(number_pivot_positions * 5):
    # Next pivot candidate position will generate our original sequence
    x = next_pivot_candidate_position(x)
    # 1. Minus one since the zero is not part of the original sequence
    pivot_position = x - 1
    # Increment with the round counter
    pivot_position = (pivot_position + round_offset) %
    number_pivot_positions
    # The primitive element will be the last in the sequence
    # so when we reach it, we can increment the round counter
    if x == primitive_element:
        round_offset += 1
```

The output for this method is shown in FIG. 11.

From this example we may derive the components of a general process as follows:

1. Given a block size g find a prime number p that satisfies p≥g.
2. For the found prime p find a primitive element e.
3. Use the primitive element to generate a sequence of pivot candidate positions.
4. For each iteration add a round offset to scramble the sequence compared to previous rounds.
5. Once the primitive element is reached, the sequence has gone one full iteration, increment the round offset and continue.

We may estimate the memory requirements of this approach. In the pseudo code above, we stored 5 integer values. These can be 8, 16, 32, or 64 bit. This yields a maximum memory requirement of 5·64 bit=5·8 bytes=40 bytes, substantially lower than the table based approach.

To generate the sequence, we first need to find a suitable finite field. To do this we may use a prime search algorithm. The number of elements in the finite field needs to be equal to, or higher than, the number of possible pivot candidate positions. When generating the field, we may select a pivot candidate position which is outside the valid range. In this case, we simply skip this and move to the next. Furthermore, once a prime has been chosen, a primitive element must be found that generates the sequence. Currently no deterministic algorithm exists to solve this problem—however several algorithms based on heuristics are proposed in the literature.

In order to simplify the search, we only search for primes for which 2 is a primitive element. Using 2 as the primitive element can yield to faster implementations since its powers can be computed using bit shifts.

Figure 12:
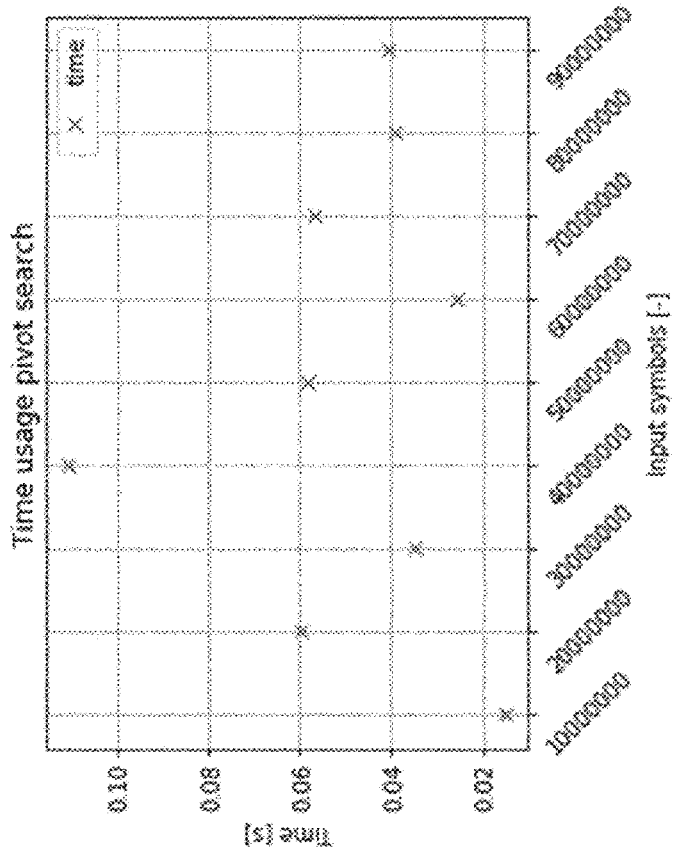

FIG. 12 shows the time taken to search for a prime with primitive element 2 in order to generate the pivot candidate positions for a specific number of source symbols. Note, that this operation only takes place once.

Figure 13:
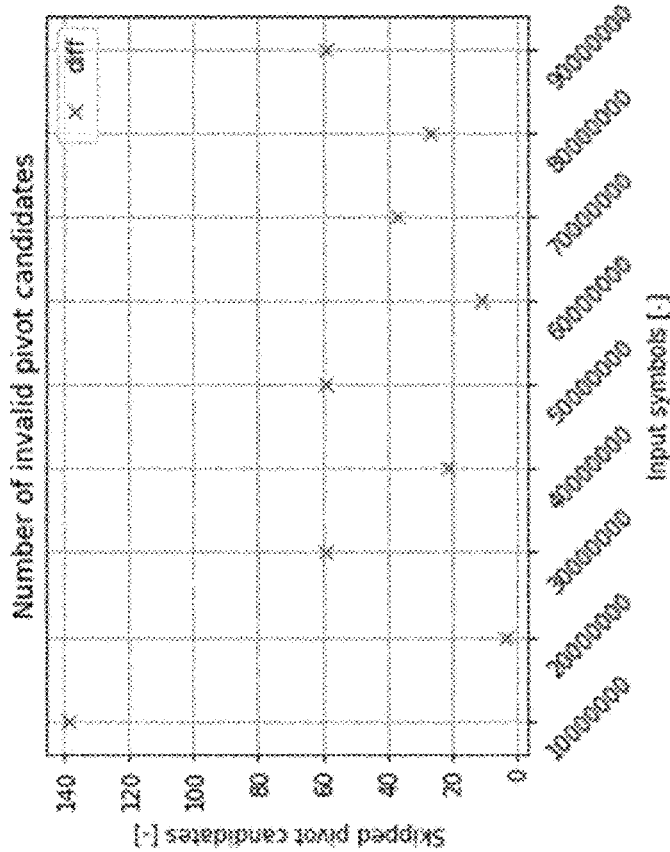
FIGS. 12 and 13 illustrate time usage and number of invalid pivot candidates respectively for implementations of a first embodiment of the present invention.

The difference between the size of the finite field and the actual block size (number of source symbols) denotes the amount of pivot candidate positions that needs to be skipped when generating the sequence, FIG. 13.

It should be noted that the overhead associated with finding a prime and primitive element only needs to be computed once for each block of source data. In addition, the prime and primitive element is only needed by the encoder. The decoder only uses actual pivot candidates to insert the coded packet.

Finally, we may remark that if advantageous, it is also possible to build a lookup table of primes and primitive elements and thereby avoid searching for these at runtime.

Other implementations to those described above are also possible, so long as they allow a random permutation of a sequence of pivot candidate positions to be generated.

In a second embodiment, repetition or omission of pivot candidates having a given position within a single round may be beneficial. For example:

If a pivot having a given position is known to have been determined by all receivers, we may omit the given position from the set of pivot candidate positions in the next round.

An encoder using UEP (Unequal Error Protection) may decide to include specific symbols more often than others (i.e. increase the likelihood of picking a pivot candidate in a specific position), in order to increase the likelihood of decoding a specific subset of symbols and so the set of pivot candidate positions may include one or more duplicates. This is beneficial if certain parts of the content/file are more important than others.

Thus, we may extend the first embodiment to cover cases where a deterministic algorithm is used to allow repetition or omission of pivot candidate positions within the same round as follows:

1. Given a block of source data containing g symbols.
2. In order to generate the pivot candidate positions 0 to g−1 for a given round i:
    a. Determine the set of pivot candidate positions including potentially omitting pivot candidate positions for symbols known to have been received by all receivers in previous rounds; duplicating pivot candidate positions for symbols which are more important than others; or reintroducing a pivot candidate position of a pivot candidate known to be lost at all receivers within the round.
    b. Pick a pivot candidate position from the set of pivot candidate positions.
    c. Remove the chosen pivot candidate position from the set of pivot candidate positions.
    d. Repeat from step 2a until the set of pivot candidate positions is empty.
3. For each subsequent round repeat step 2.

Again, in step 2b, the positions of pivot candidates are picked so that the sequence of pivot candidate positions for a round is non-linear with respect to one another and so that repetition of a pivot candidate position within the round is only to deliberately re-transmit information known a priori to be critical, to prevent a delay in re-transmission in the event of loss; or to re-transmit a coded packet within a round, if loss to all receivers is known to have occurred with a round.

It is also possible for the set of pivot candidate positions to change dynamically within a given round. Thus, if feedback is available from the receivers to the sender before a round is complete, we may reintroduce a pivot candidate in a same position of a pivot candidate known to be lost at all receivers within a round and re-transmit an encoded packet based on that encoded pivot candidate within the round.

Nonetheless, it will be appreciated that implementations of the present application find particular utility in distributing information, for example, software or media updates to a large number of receivers, particularly, receivers with limited computational resources, where no feedback is available.

The invention claimed is:

1. A method for encoding data comprising:
    a) choosing a sequence of pivot candidate positions for a sequence of g encoding vectors to encode a block of g data symbols in a round of g encoded packets by:
        i) providing a set of g pivot candidate positions;
        ii) choosing a pivot candidate position for the sequence from the set of pivot candidate positions;
        iii) removing the chosen pivot candidate position from the set of pivot candidate positions; and
        iv) repeating from step ii) until the set of pivot candidate positions is empty and the sequence of chosen pivot candidate positions for the round is non-linear;
    b) generating the sequence of g encoding vectors based on the chosen sequence of pivot candidate positions, each encoding vector comprising zero valued coefficients for positions within the encoding vector before the pivot candidate position for the encoding vector and a non-zero valued coefficient for at least the pivot candidate position;
    c) generating a set of encoded data symbols by encoding said block of data symbols with respective generated encoding vectors;
    d) generating encoded packets each including a respective encoded data symbol and information representing the encoding vector used for encoding the data symbol;
    e) transmitting the encoded packets to a plurality of receivers across a network; and
    f) for at least one subsequent round permuting the sequence of chosen pivot candidate positions so that the sequence of chosen pivot candidate positions changes from round to round and then repeating steps b) to e).

2. The method of claim 1 wherein said permuting ensures that a unique pivot candidate position for a round does not appear in the same position in a sequence of chosen pivot candidate positions for a successive round.

3. The method of claim 1 wherein said permuting step comprises offsetting the sequence of chosen pivot candidate positions from a previous round to generate the sequence of pivot candidate positions for a subsequent round.

4. The method of claim 1 wherein step ii) comprises choosing at random a pivot candidate position from the set of pivot candidate positions.

5. The method according to claim 1 wherein the encoding scheme is sparse and only a subset of coefficients in subsequent positions of an encoding vector following the pivot candidate position are non-zero valued.

6. The method according to claim 1 where if a given data symbol of said block of data symbols is more critical than other data symbols, the method comprises including a pivot candidate position corresponding to a position of said data symbol in said block of data symbols more than once in said set of pivot candidate positions.

7. The method according to claim 1 comprising reducing g for subsequent rounds in response to receiving information that one or more data symbols have been received by all receivers.

8. The method according to claim 1 wherein said set of g pivot candidate positions comprise elements of a finite field having p≥g elements and wherein said steps of choosing a pivot candidate position and removing the chosen pivot candidate position are performed by traversing the finite field based on generating increasing powers of a primitive element of the finite field.

9. The method according to claim 1 further comprising storing said sequence of chosen pivot candidate positions in a table.

10. A computer program product comprising non-transitory computer readable code stored in a computer readable medium and including instructions which when executed in an encoder are configured to perform the steps of claim 1.

11. An encoder configured to receive a block of data to be transmitted to one or more receivers and including a processor configured to perform the steps of claim 1.

* * * * *